US011949218B2

(12) United States Patent
Shibata et al.

(10) Patent No.: US 11,949,218 B2
(45) Date of Patent: Apr. 2, 2024

(54) ELECTRICAL CONNECTION BOX

(71) Applicant: SUMITOMO WIRING SYSTEMS, LTD., Mie (JP)

(72) Inventors: Go Shibata, Mie (JP); Toshihisa Sanuki, Mie (JP)

(73) Assignee: SUMITOMO WIRING SYSTEMS, LTD., Mie (JP)

(*) Notice: Subject to any disclaimer, the term of this patent is extended or adjusted under 35 U.S.C. 154(b) by 330 days.

(21) Appl. No.: 17/612,009

(22) PCT Filed: Mar. 13, 2020

(86) PCT No.: PCT/JP2020/011299
§ 371 (c)(1),
(2) Date: Nov. 17, 2021

(87) PCT Pub. No.: WO2020/240992
PCT Pub. Date: Dec. 3, 2020

(65) Prior Publication Data
US 2022/0231496 A1 Jul. 21, 2022

(30) Foreign Application Priority Data
May 28, 2019 (JP) .................................. 2019-099511

(51) Int. Cl.
H02G 3/08 (2006.01)
B60R 16/023 (2006.01)
H01R 13/52 (2006.01)

(52) U.S. Cl.
CPC ......... *H02G 3/088* (2013.01); *B60R 16/0238* (2013.01); *B60R 16/0239* (2013.01); *H01R 13/5205* (2013.01); *H02G 3/083* (2013.01)

(58) Field of Classification Search
CPC ........ H02G 3/088; H02G 3/083; B60R 16/02; B60R 16/0239; B60R 16/0238; H05K 7/00; H05K 5/06; H01R 13/5205
See application file for complete search history.

(56) References Cited

U.S. PATENT DOCUMENTS 3,567,843 A * 3/1971 Collins ................ H02G 3/0616
285/341
5,403,976 A * 4/1995 Maurice ................ H02G 3/088
174/652

(Continued)

FOREIGN PATENT DOCUMENTS

JP 2013-074681 A 4/2013
JP 2015-050809 A 3/2015
JP 2017-050932 A 3/2017

OTHER PUBLICATIONS

International Search Report dated May 19, 2020 for WO 2020/240992 A1 (4 pages).

*Primary Examiner* — Steven T Sawyer
(74) *Attorney, Agent, or Firm* — Venjuris, P.C.

(57) ABSTRACT

Provided is an electrical connection box that is able to ensure water stopping capability in a harness insertion channel. The electrical connection box is provided with a box-like main body part 15 having a harness insertion channel 14, a wire harness W drawn outside the main body part 15 through the harness insertion channel 14, and a water stopping sheet 30 wrapped around the outer circumferential surface of the wire harness W in the harness insertion channel 14. The water stopping sheet 30 is characterized by having higher water stopping capability due to being compressed than when not compressed, and the water stopping sheet 30 is rendered into a water stopping state by being compressed by the harness insertion channel 14 and the outer circumferential surface of the wire harness W.

4 Claims, 2 Drawing Sheets

(56) References Cited

U.S. PATENT DOCUMENTS

2010/0136805 A1* 6/2010 Maebashi .......... B60R 16/0238
439/76.2
2014/0353926 A1 12/2014 Fukuda

* cited by examiner

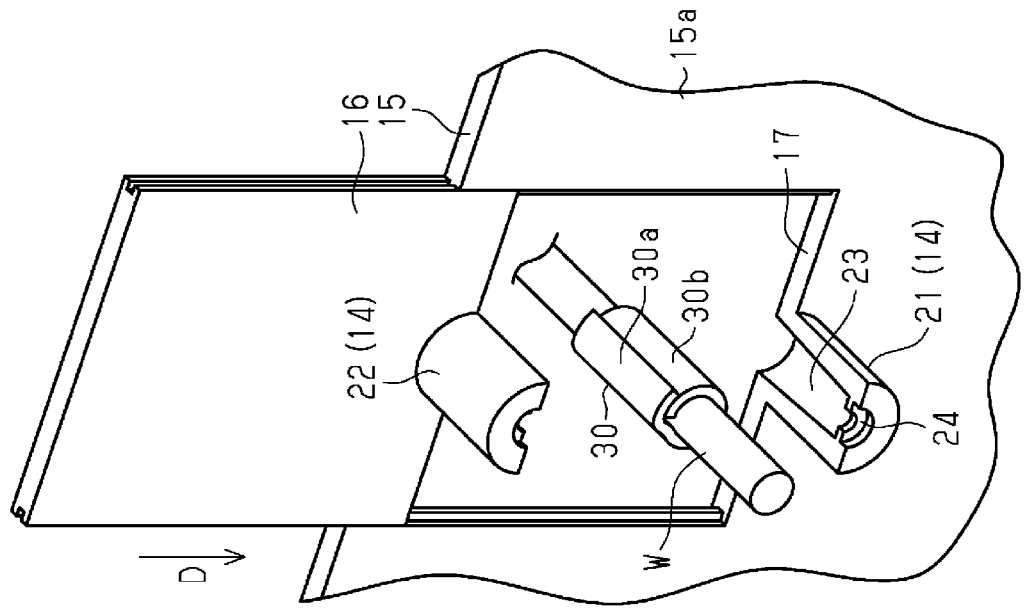
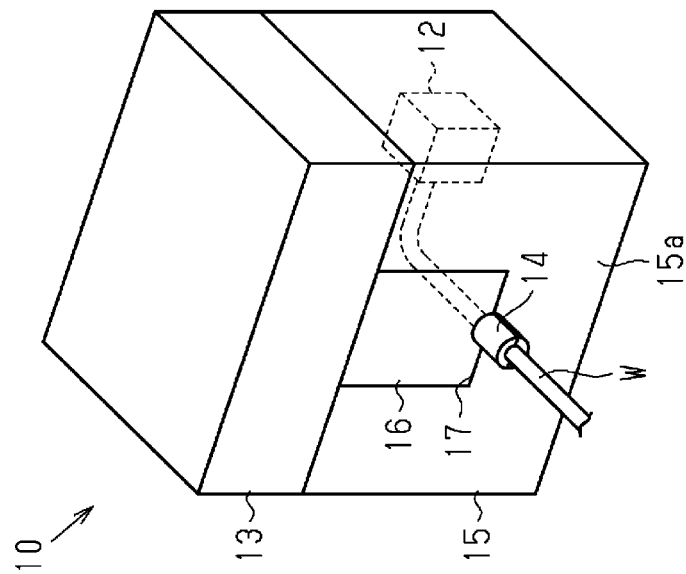

ELECTRICAL CONNECTION BOX

CROSS REFERENCE TO RELATED APPLICATIONS

This application is a national phase of PCT application No. PCT/JP2020/011299, filed on 13 Mar. 2020, which claims priority from Japanese patent application No. 2019-099511, filed on 28 May 2019, all of which are incorporated herein by reference.

TECHNICAL FIELD

The present disclosure relates to an electrical connection box.

BACKGROUND

Heretofore, electrical connection boxes such as relay boxes and fuse boxes have been used in vehicles for the purpose of increasing the efficiency of electric wiring and improving maintainability (e.g., see Patent Document 1). An electrical connection box is equipped with electrical components such as relays and fuses as appropriate, and is configured to supply power from a battery or the like to in-vehicle electrical equipment. Also, a plurality of electrical wires are connected to the electrical components in the electrical connection box. A wire harness consisting of a bundle of these wires is drawn outside a box-like main body part of the electrical connection box through a harness insertion channel formed to pass through the main body part.

PRIOR ART DOCUMENT

Patent Document

Patent Document 1: JP 2013-074681 A

SUMMARY OF THE INVENTION

Problems to be Solved

The inventors of the present invention investigated how to inhibit infiltration of rainwater and the like into the box-like main body part through the harness insertion channel in electrical connection boxes such as the above.

In view of this, an object of the invention is to provide an electrical connection box that is able to ensure water stopping capability in a harness insertion channel.

Means to Solve the Problem

An electrical connection box of the present disclosure includes a box-like main body part having a harness insertion channel, a wire harness drawn outside the main body part through the harness insertion channel from inside the main body part, and a water stopping sheet wrapped around an outer circumferential surface of the wire harness in the harness insertion channel, the water stopping sheet being characterized by having higher water stopping capability due to being compressed than when not compressed, and the water stopping sheet being rendered into a water stopping state by being compressed by the harness insertion channel and the outer circumferential surface of the wire harness.

Effect of the Invention

According to the present disclosure, it becomes possible to provide an electrical connection box that is able to ensure water stopping capability in a harness insertion channel.

BRIEF DESCRIPTION OF THE DRAWINGS

FIG. 1 is a perspective view showing a schematic configuration of an electrical connection box according to an embodiment.

FIG. 2 is an exploded perspective view showing a configuration of the periphery of a harness insertion channel in the electrical connection box of the embodiment.

DETAILED DESCRIPTION TO EXECUTE THE INVENTION

Description of Embodiments of Disclosure

Figure 3:
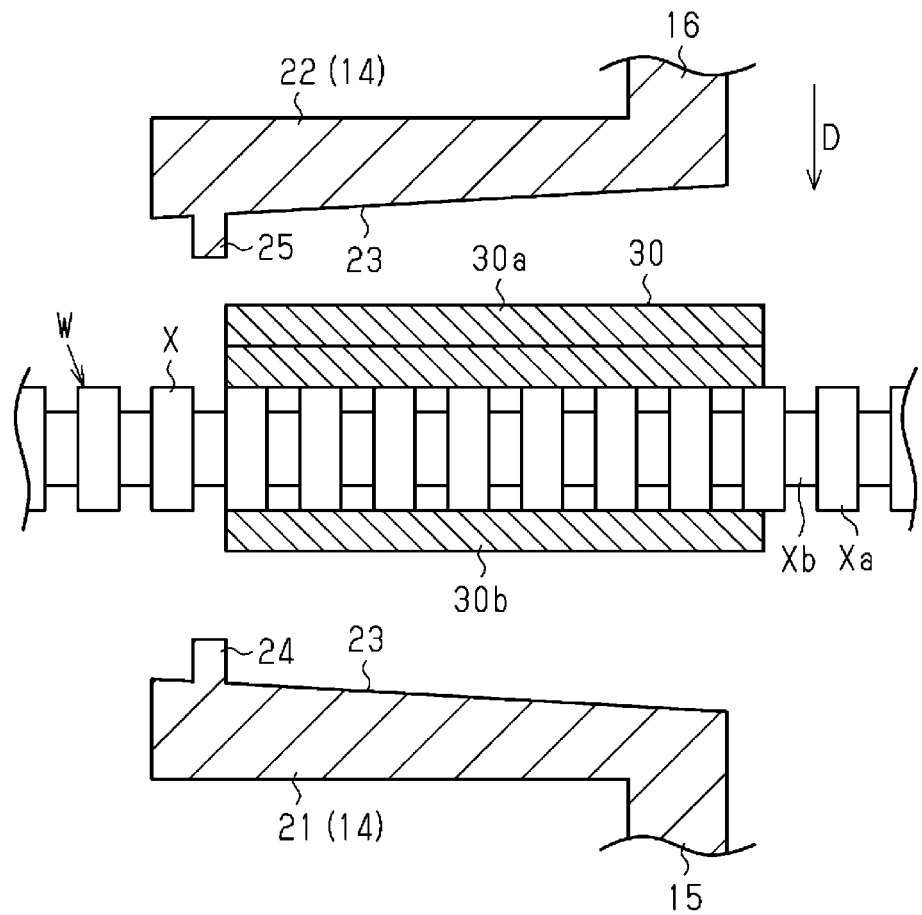
FIG. 3 is a schematic cross-sectional view for describing a mode of assembling a wire harness to the harness insertion channel in the electrical connection box of the embodiment.

Initially, embodiments of the present disclosure will be enumerated and described.

[1] An electrical connection box of the present disclosure includes a box-like main body part having a harness insertion channel, a wire harness drawn outside the main body part through the harness insertion channel from inside the main body part, and a water stopping sheet wrapped around an outer circumferential surface of the wire harness in the harness insertion channel, the water stopping sheet being characterized by having higher water stopping capability due to being compressed than when not compressed, and the water stopping sheet being rendered into a water stopping state by being compressed by the harness insertion channel and the outer circumferential surface of the wire harness. Water stopping capability in the harness insertion channel can thereby be ensured by a water stopping sheet that is rendered into a water stopping state by being compressed by the harness insertion channel and the outer circumferential surface of the wire harness.

[2] Preferably, the water stopping sheet is formed with semi-closed cell foam. Also, since semi-closed cell foam is readily deformable compared with closed cell foam, it becomes possible to inhibit deterioration of the assemblability of the water stopping sheet.

[3] Preferably, the harness insertion channel has a structure divided into a first divided part and a second divided part in a circumferential direction, and an inner circumferential surface of the harness insertion channel is provided with a sloped surface sloping relative to a central axis of the harness insertion channel. It is thereby possible to apply sufficient pressure to the water stopping sheet to ensure the water stopping capability, while keeping the force needed to assemble the first divided part and the second divided part to the portion of the wire harness wrapped in the water stopping sheet to a small force.

[4] Preferably, at a wrapping end part of the water stopping sheet, there is an overlapping part in which the number of laminations of the water stopping sheet is greater than at other portions in the circumferential direction. According to this configuration, the thickness (lamination thickness) of the water stopping sheet is not uniform in the circumferential direction, but even in such a case, it is possible to prevent the occurrence of portions where the water stopping sheet is not compressed to a water stopping state, by providing the above sloped surface on the inner circumferential surface of the harness insertion channel.

[5] Preferably, the harness insertion channel is formed to extend on an outer side of the main body part from an outer surface of the main body part, and the sloped surface is formed from an inner side end part of the harness insertion channel to an outer side end part of the harness insertion channel. The sloped surface can thereby be constituted to have a gentle slope angle, and, as a result, it becomes possible to apply a favorable pressure to the water stopping sheet.

DETAILS OF EMBODIMENTS OF DISCLOSURE

Specific examples of an electrical connection box of the present disclosure will be described below with reference to the drawings. Note that the invention is not limited to these illustrative examples, and is indicated by the claims, and all changes that come within the meaning and range of equivalency of the claims are intended to be embraced therein. Also, in the drawings, parts of the configuration may be shown in an exaggerated manner for convenience of description. The size ratios of various portions may also differ from the actual size ratios.

As shown in FIG. 1, an electrical connection box 10 has a box-like main body part 15, an electrical component 12 housed in the electrical connection box 10, and a cover 13 assembled to the main body part 15 of the electrical connection box 10. The electrical connection box 10 of the present embodiment is constituted as a relay box, a fuse box or the like that is mounted between a plurality of pieces of electrical equipment installed in a vehicle and a battery or the like, and supplies power to the electrical equipment. Note that, the electrical component 12 of the present embodiment is constituted by one or a plurality of relay modules having a plurality of relays, one or a plurality of fuse modules having a plurality of fuses, or the like, for example. Also, the main body part 15 and the cover 13 are injection-molded parts that are made from a synthetic resin material, for example.

An approximately cylindrical harness insertion channel 14 for drawing out a wire harness W consisting of a bundle of wires connected to the electrical component 12 is formed in an outer wall of the box-like main body part 15. The harness insertion channel 14 is formed to extend on the outer side of the main body part 15 from the outer surface of the box-like main body part 15. The wire harness W connected to the electrical component 12 inside the electrical connection box 10 is drawn outside the electrical connection box 10 through the harness insertion channel 14. Note that the numbers of electrical components 12 and electrical wires connected to the electrical component 12 differ in specification depending on the type or grade of vehicle.

The electrical connection box 10 has a separate component 16 assembled to the main body part 15. The separate component 16 constitutes part of the outer wall of the electrical connection box 10 (more specifically, outer wall of main body part 15). The separate component 16 is mounted to an attachment recessed part 17 formed in a cutout manner in an outer wall 15a of the box-like main body part 15 in a mode of being slid in an attachment direction D. The attachment direction D of the separate component 16 of the present embodiment is set to be orthogonal to the length direction of the harness insertion channel 14 (orthogonal to opening direction of harness insertion channel 14, i.e., length direction of wire harness W passing through harness insertion channel 14). Note that orthogonal in the present disclosure does not mean orthogonal in the strict sense, and has a margin in a range in which the effects of the invention are achieved as long as the range can be regarded as being orthogonal.

Configuration of Harness Insertion Path 14

As shown in FIGS. 2 and 3, the approximately cylindrical harness insertion channel 14 has a structure divided in half in the circumferential direction thereof. That is, the harness insertion channel 14 is provided with a first divided part 21 constituting one half portion in the circumferential direction thereof, and a second divided part 22 constituting the remaining half portion in the circumferential direction.

The first divided part 21 is formed on the box-like main body part 15. Specifically, the first divided part 21 extends on the outer side of the electrical connection box 10 from a bottom edge part of the attachment recessed part 17. The second divided part 22 is formed on the separate component 16. Specifically, the second divided part 22 extends on the outer side of the electrical connection box 10 from the leading end part of the separate component 16 in the attachment direction D. The first divided part 21 and the second divided part 22 each have a circular arc shape as viewed from the length direction of the harness insertion channel 14 (length direction of wire harness W passing through harness insertion channel 14). The approximately cylindrical shape of the harness insertion channel 14 is formed by the first divided part 21 and the second divided part 22 being brought together. Also, the first divided part 21 and the second divided part 22 oppose each other along the entire length of the harness insertion channel 14.

A sloped surface 23 sloping relative to the length direction of the harness insertion channel 14 (length direction of wire harness W passing through harness insertion channel 14) is formed on the inner circumferential surface of the harness insertion channel 14. In the present embodiment, the sloped surface 23 is formed along the entire length of the harness insertion channel 14. That is, the sloped surface 23 is formed from an inner side end part 14a to an outer side end part 14b of the harness insertion channel 14. Also, the sloped surface 23 slopes so as to narrow radially toward the outer side end part 14b of the harness insertion channel 14. That is, the sloped surface 23 slopes so as to approach a central axis L of the harness insertion channel 14 (central axis along length direction; see FIG. 4) toward the outer side end part 14b of the harness insertion channel 14. Also, the sloped surface 23 is formed at a portion where the wire harness W wrapped in a water stopping sheet 30 is sandwiched by the first divided part 21 and the second divided part 22. That is, the portion of the wire harness W wrapped in the water stopping sheet 30 is sandwiched by the sloped surface 23 on the first divided part 21 side and the sloped surface 23 on the second divided part 22 side.

A locking raised part 24 that protrudes on the inner circumference side is formed on the inner circumferential surface (sloped surface 23) of the first divided part 21. Also, a locking raised part 25 that protrudes on the inner circumference side is formed on the inner circumferential surface (sloped surface 23) of the second divided part 22. In a state where the first divided part 21 and the second divided part 22 are brought together, the locking raised part 24 of the first divided part 21 and the locking raised part 25 of and the second divided part 22 form a ring shape continuously in the circumferential direction.

Figure 4:
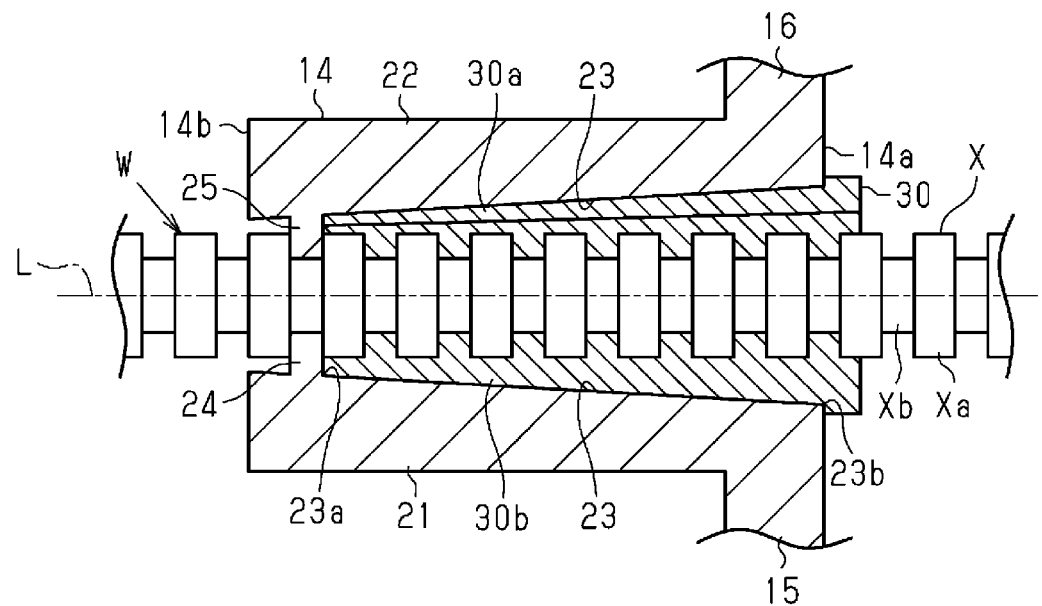
FIG. 4 is a schematic cross-sectional view showing the configuration of the periphery of the harness insertion channel in the electrical connection box of the embodiment.

As shown in FIGS. 3 and 4, a tubular exterior member X that covers the outer circumference of the wire harness W is mounted to the wire harness W that is inserted into the harness insertion channel 14 (see FIG. 4). The exterior member X of the present embodiment is a corrugated tube having a bellows structure in which an annular raised part Xa and an annular recessed part Xb are connected alternately along the length direction, for example. Note that a resin material that does not have conductivity is used as the material of the exterior member X. Also, as for the resin material that is used for the exterior member X, a synthetic resin such as polyolefin, polyamide, polyester and ABS resin can be used, for example.

In a state where the separate component 16 is assembled to the main body part 15, the locking raised part 24 of the first divided part 21 and the locking raised part 25 of the second divided part 22 fit into the annular recessed part Xb of the exterior member X. Position shift of the exterior member X in the length direction of the wire harness W is thereby inhibited.

Configuration of Water Stopping Sheet 30

The water stopping sheet 30 is interposed between the inner circumferential surface of the harness insertion channel 14 and the outer circumferential surface of the wire harness W. The water stopping sheet 30 is wrapped around the outer circumference of the exterior member X. The water stopping sheet 30 has an overlapping part 30a (overlap margin) where, at the wrapping end part, the number of laminations of the water stopping sheet 30 is greater than at other portions in the circumferential direction. Thus, the water stopping sheet 30 is thicker at the overlapping part 30a than at other portions. Accordingly, the thickness (lamination thickness) of the water stopping sheet 30 is not uniform in the circumferential direction (wrapping direction) of the wire harness W. Note that the water stopping sheet 30 of the present embodiment in a state before being wrapped around the wire harness W is formed in a rectangular shape.

The water stopping sheet 30 is formed with semi-closed cell foam whose main component is EPDM (ethylene propylene diene rubber), for example. Semi-closed cell foam is constituted with some of the cells inside the foam being interconnected, and has portions that lack water stopping capability, but is able to ensure sufficient water stopping capability due to the cells that are constituted in an interconnected manner collapsing under compression. Note that, as for the semi-closed cell foam that is used for the water stopping sheet 30 of the present embodiment, Everlight Moran produced by Bridgestone Corporation (registered trademark), EPT-sealer produced by Nitto Denko Corporation (registered trademark) and the like can be employed, for example.

Here, urethane foam that is generally used as the water stopping sheet in a conventional electrical connection box is formed with open cell foam. Given that open cell foam is constituted with substantially all of the cells being interconnected with adjacent cells, there is a limit to ensuring water stopping capability, since it is difficult to prevent infiltration of water that has passed through interconnected cells even when the foam is compressed. In particular, in the case of using aluminum wires (aluminum alloy wires) for the wires of the wire harness W, and connecting these aluminum wires to a different type of metal (copper terminals, etc.) within the electrical connection box 10, a higher level of water stopping capability in the harness insertion channel 14 is required in order to prevent electric corrosion, but this higher level of water stopping capability is difficult to achieve with open cell foam.

Also, given that closed cell foam which differs from semi-closed cell foam is constituted with the cells inside the foam being independent from each other, closed cell foam has water stopping capability even in a natural state. However, closed cell foam is not as readily deformable as semi-closed cell foam, due to having a configuration in which the cells inside the foam are independent from each other, as aforementioned. Thus, if closed cell foam is used for the water stopping sheet 30, a large force is required when squeezing the water stopping sheet of closed cell foam wrapped around the wire harness W between the first divided part 21 and the second divided part 22, at the time of assembling the separate component 16 to the main body part 15 in the attachment direction D.

The operation of the present embodiment will now be described.

When assembling the wire harness W to the electrical connection box 10, first, the portion of the wire harness W wrapped in the water stopping sheet 30 is disposed in the first divided part 21 of the main body part 15. Then, the separate component 16 is attached to the attachment recessed part 17 of the main body part 15 by being slid in the attachment direction D. At this time, the water stopping sheet 30 wrapped around the wire harness W is sandwiched between the first divided part 21 of the main body part 15 and the second divided part 22 of the separate component 16 along the attachment direction D. The water stopping sheet 30 is thereby compressed in the thickness direction of the water stopping sheet 30 by the inner circumferential surface of the harness insertion channel 14 (inner circumferential surface of first divided part 21 and inner circumferential surface of second divided part 22) and the wire harness W (more specifically, exterior member X on outer circumference of wire harness W). Also, at this time, the locking raised part 24 of the first divided part 21 and the locking raised part 25 of the second divided part 22 are located on the outer side of the electrical connection box 10 relative to the water stopping sheet 30, and fit into the annular recessed part Xb of the exterior member X.

As aforementioned, the water stopping sheet 30 has the overlapping part 30a at the wrapping end part, and thus the thickness (lamination thickness) of the water stopping sheet 30 is not uniform in the circumferential direction. Here, a comparative configuration that differs from the present embodiment, that is, a comparative configuration in which the inner diameter of the harness insertion channel 14 is uniform in the length direction of the harness insertion channel 14, will be considered. In this comparative configuration, when the inner diameter of the harness insertion channel 14 is adjusted to the outer diameter of the overlapping part 30a of the water stopping sheet 30, the portion other than overlapping part 30a of the water stopping sheet 30 (in the drawings, non-overlapping part 30b) will be difficult to compress to a water stopping state. On the other hand, when the inner diameter of the harness insertion channel 14 is adjusted to the outer diameter of the non-overlapping part 30b of the water stopping sheet 30, a large force will be needed to squeeze the overlapping part 30a, and assemblability of the separate component 16 deteriorates. Thus, with this comparative configuration, it is difficult to set the inner diameter of the harness insertion channel 14.

In that respect, the sloped surface 23 sloping relative to the central axis L of the harness insertion channel 14 is formed on the inner circumferential surface of the harness insertion channel 14 of the present embodiment. Also, the inner diameter of a minimum diameter portion 23*a* (in the present embodiment, portion on box inner side of locking raised parts 24 and 25) of the portion of the sloped surface 23 that compresses the water stopping sheet 30 is set smaller than the outer diameter of the non-overlapping part 30*b* of the water stopping sheet 30. The sloped surface 23 thereby widens radially toward the inner side end part 14*a* of the harness insertion channel 14, while compressing the non-overlapping part 30*b* and the overlapping part 30*a* of the water stopping sheet 30 to a water stopping state with the minimum diameter portion 23*a* of the sloped surface 23, thus allowing the force needed to squeeze the water stopping sheet 30 to be relaxed. That is, at a maximum diameter portion 23*b* (in the present embodiment, portion of sloped surface 23 at inner side end part 14*a* of harness insertion channel 14) of the portion of the sloped surface 23 that compresses the water stopping sheet 30, the non-overlapping part 30*b* of the water stopping sheet 30 does not need to be compressed to a water stopping state. Note that, in the present embodiment, the inner diameter of the minimum diameter portion 23*a* of the sloped surface 23 is set such that the compression ratio at which the non-overlapping part 30*b* is compressed by the minimum diameter portion 23*a* of the sloped surface 23 will be greater than or equal to the value at which the water stopping state of the water stopping sheet 30 can be ensured (35% or more in the case of the aforementioned Everlight Moran). The sloped surface 23 of the harness insertion channel 14 is an example of a pressing surface that presses the water stopping sheet 30.

The effects of the present embodiment will now be described.

(1) The water stopping sheet 30 is characterized by having higher water stopping capability due to being compressed than when not compressed, and the water stopping sheet 30 is rendered into a water stopping state due to being compressed by the inner circumferential surface of the harness insertion channel 14 and the outer circumferential surface of the wire harness W. Water stopping capability in the harness insertion channel 14 can thereby be ensured by the water stopping sheet 30 that is compressed to a water stopping state by the inner circumferential surface of the harness insertion channel 14 and the outer circumferential surface of the wire harness W.

(2) The water stopping sheet 30 is semi-closed cell foam. Since semi-closed cell foam is readily deformable compared with closed cell foam, it becomes possible to relax the force needed to squeeze the water stopping sheet 30 between the first divided part 21 and the second divided part 22, and, as a result, it becomes possible to inhibit deterioration of the assembly workability of the separate component 16.

(3) The harness insertion channel 14 has a structure divided into the first divided part 21 and the second divided part 22 in the circumferential direction. Also, the inner circumferential surface of the harness insertion channel 14 is provided with the sloped surface 23 sloping relative to the central axis L of the harness insertion channel 14. It is thereby possible to apply sufficient pressure to the non-overlapping part 30*b* of the water stopping sheet 30 to ensure the water stopping capability, while keeping the force needed to assemble the first divided part 21 and the second divided part 22 to the portion of the wire harness W wrapped in the water stopping sheet 30 to a small force.

(4) At the wrapping end part of the water stopping sheet 30, there is the overlapping part 30*a* in which the number of laminations of the water stopping sheet 30 is greater than at other portions in the circumferential direction. According to this configuration, the thickness (lamination thickness) of the water stopping sheet 30 is not uniform in the circumferential direction, but even in such a case, it is possible to prevent the occurrence of portions where the water stopping sheet 30 is not compressed to a water stopping state, by providing the sloped surface 23 on the inner circumferential surface of the harness insertion channel 14.

(5) The harness insertion channel 14 is formed to extend on the outer side of the box-like main body part 15 from the outer surface of this main body part 15, and the sloped surface 23 is formed to extend from the inner side end part 14*a* of the harness insertion channel 14 to the outer side end part 14*b* of the harness insertion channel 14. The sloped surface 23 can thereby be constituted to have a gentle slope angle, and, as a result, it becomes possible to favorably apply pressure to the water stopping sheet 30.

(6) The sloped surface 23 slopes so as to approach the central axis L of the harness insertion channel 14 toward the outer side end part 14*b* of the harness insertion channel 14. According to this mode, the thickness of the outer side end part 14*b* of the harness insertion channel 14 can be ensured, and, hence, the rigidity of the outer side end part 14*b* of the harness insertion channel 14 can be ensured.

The present embodiment can be carried out by making changes such as the following. The present embodiment and the following example changes can be carried out in combination with each other as long as there are no technical inconsistencies.

The sloped surface 23 of the above embodiment narrows radially toward the outer side of the harness insertion channel 14, but may be formed to widen radially toward the outer side of the harness insertion channel 14.

The sloped surface 23 of the above embodiment is formed along the entire length of the harness insertion channel 14, that is, from the inner side end part 14*a* to the outer side end part 14*b*, but is not limited thereto, and a sloped surface may be formed along part of the length of the harness insertion channel 14.

In the above embodiment, the material of the water stopping sheet 30 is given as semi-closed cell foam, but is not particularly limited thereto, and a material other than semi-closed cell foam can also be employed as long as the material is characterized by having higher water stopping capability due to being compressed than when not compressed.

The harness insertion channel 14 of the above embodiment is formed to extend on the outer side of the box-like main body part 15 from the outer surface of this main body part 15, but is not particularly limited thereto, and may be constituted to not extend on the outer side from the outer surface of the main body part 15.

The technical concepts that can be grasped from the above embodiment and example changes will now be recited.

(1) An electrical connection box in which the sloped surface slopes so as to approach the central axis of the harness insertion channel toward the outer side of the harness insertion channel.

According to this mode, the thickness of the outer side end part of the harness insertion channel can be ensured, and, hence, the rigidity of the outer side end part of the harness insertion channel can be ensured.

(2) The electrical connection box in which the sloped surface is formed at a portion where the wire harness wrapped in the water stopping sheet is sandwiched by the first divided part and the second divided part.

According to this mode, it becomes possible to favorably apply pressure to the water stopping sheet.

(3) The wire harness (W) includes an exterior member (X) having a bellows structure in which an annular raised part (Xa) and an annular recessed part (Xb) are connected alternately along the length direction, the outer circumferential surface of the wire harness (W) is the outer circumferential surface of the exterior member (X), and the harness insertion channel (14) is provided with a locking raised part (24, 25) that protrudes on the inner circumference side from the inner circumferential surface of the harness insertion channel (14), and fits into the annular recessed part of the exterior member (X).

(4) The locking raised part (24, 25) of the harness insertion channel has a radially inward-facing end face constituted to correspond to, conform to or surface contact the outer circumferential surface of the annular recessed part (Xb) of the exterior member (X).

(5) The outer circumferential surface of the annular recessed part (Xb) of the exterior member (X) is a convex curved surface, and the radially inward-facing end face of the locking raised part (24, 25) is a concave curved surface.

(6) The wire harness (W) includes aluminum or aluminum alloy wires that are to be connected to a different type of metal than aluminum.

(7) The harness insertion channel (14) can have a long groove constituted to receive the wire harness (W) from a radial direction of the wire harness (W) that intersects or is orthogonal to the longitudinal direction of the wire harness (W).

(8) The long groove of the harness insertion channel (14) can include a pressing surface (23) constituted to contact the outer circumferential surface of the water stopping sheet (30) around the entire circumference, and press the entire circumference of the water stopping sheet (30) in the thickness direction of the water stopping sheet (30).

(9) The water stopping sheet (30) may be an elastic water stopping roll that is wrapped around the outer circumferential surface of the wire harness (W), and has a first sheet edge, a second sheet edge, and an overlapping part (30a) of a first length that extends from the first sheet edge to the second sheet edge, and the pressing surface (23) of the harness insertion channel (14) has a second length that is shorter than the first length.

(10) The water stopping sheet (30) has a constant thickness in a non-compressed state or in a natural state before being wrapped around the outer circumferential surface of the wire harness (W).

(11) The overlapping part (30a) of the water stopping sheet (30) pressed by the pressing surface (23) of the harness insertion channel (14) has a first thickness at the first sheet edge, and has a second thickness at the second sheet edge, with the first thickness being smaller than the second thickness.

(12) The locking raised part (24, 25) is constituted to contact the first sheet edge of the water stopping sheet (30) in the length direction.

LIST OF REFERENCE NUMERALS

D Attachment direction
L Central axis
W Wire harness
X Exterior member
Xa Annular raised part
Xb Annular recessed part
10 Electrical connection box
12 Electrical component
13 Cover
14 Harness insertion channel
14a Inner side end part
14b Outer side end part
15 Main body part
15a Outer wall
16 Separate component
17 Attachment recessed part
21 First divided part
22 Second divided part
23 Sloped surface
23a Minimum diameter portion
23b Maximum diameter portion
24 Locking raised part
25 Locking raised part
30 Water stopping sheet
30a Overlapping part
30b Non-overlapping part

What is claimed is:

1. An electrical connection box comprising: a box-like main body part having a harness insertion channel; a wire harness drawn outside the main body part through the harness insertion channel from inside the main body part; and a water stopping sheet wrapped around an outer circumferential surface of the wire harness in the harness insertion channel, wherein the water stopping sheet is characterized by having higher water stopping capability due to being compressed than when not compressed, the water stopping sheet is rendered into a water stopping state by being compressed by the harness insertion channel and the outer circumferential surface of the wire harness, the harness insertion channel has a structure divided into a first divided part and a second divided part in a circumferential direction, an inner circumferential surface of the harness insertion channel is provided with a sloped surface sloping relative to a central axis of the harness insertion channel, the wire harness includes an exterior member having a bellows structure in which an annular raised part and an annular recessed part are connected alternately along a length direction, and the outer circumferential surface of the wire harness is an outer circumferential surface of the exterior member, and the harness insertion channel is provided with a locking raised part that protrudes on an inner circumference side from the inner circumferential surface at a distal end of the harness insertion channel relative to the main body part, and fits into and in direct contact with the annular recessed part of the exterior member without passing through the water stopping sheet.

2. The electrical connection box according to claim 1, wherein the water stopping sheet is formed with semi-closed cell foam.

3. The electrical connection box according to claim 1, wherein, at a wrapping end part of the water stopping sheet, there is an overlapping part in which the number of laminations of the water stopping sheet is greater than at other portions in the circumferential direction.

4. The electrical connection box according to claim 1, wherein the harness insertion channel is formed to extend on an outer side of the main body part from an outer surface of the main body part, and
the sloped surface is formed from an inner side end part of the harness insertion channel to an outer side end part of the harness insertion channel.

* * * * *